(12) United States Patent
Aram et al.

(10) Patent No.: US 6,417,725 B1
(45) Date of Patent: Jul. 9, 2002

(54) HIGH SPEED REFERENCE BUFFER

(75) Inventors: Farbod Aram; Sehat Sutardja, both of Cupertino, CA (US)

(73) Assignee: Marvell International, Ltd., Hamilton (BM)

( * ) Notice: Subject to any disclaimer, the term of this patent is extended or adjusted under 35 U.S.C. 154(b) by 0 days.

(21) Appl. No.: 09/648,462

(22) Filed: Aug. 28, 2000

(51) Int. Cl.⁷ .................................................. G05F 1/56
(52) U.S. Cl. ........................ 327/541; 327/543; 341/155; 323/313
(58) Field of Search ................................. 327/530, 538, 327/540, 541, 536, 545, 546; 323/311, 313; 341/118, 120, 143, 155

(56) References Cited

U.S. PATENT DOCUMENTS

| | | | |
|---|---|---|---|
| 5,162,668 A | * 11/1992 | Chen et al. ................. | 327/541 |
| 5,548,205 A | 8/1996 | Monticelli ................... | 323/274 |
| 5,648,718 A | 7/1997 | Edwards ...................... | 323/274 |
| 5,706,240 A | * 1/1998 | Fiocchi et al. .............. | 327/540 |
| 5,852,359 A | 12/1998 | Callahan, Jr. et al. ...... | 323/274 |
| 5,909,109 A | 6/1999 | Philips ........................ | 323/277 |
| 5,929,616 A | 7/1999 | Perraud et al. ............. | 323/274 |
| 6,011,666 A | 1/2000 | Wakamatsu .................. | 360/69 |
| 6,061,306 A | 5/2000 | Buchheim ...................... | 369/2 |
| 6,084,387 A | 7/2000 | Kaneko et al. ............. | 323/281 |
| 6,184,746 B1 | * 2/2001 | Crowley ...................... | 327/551 |
| 6,188,212 B1 | * 2/2001 | Larson et al. ............... | 323/281 |
| 6,194,887 B1 | * 2/2001 | Tsukada ..................... | 327/535 |

FOREIGN PATENT DOCUMENTS

| | | | |
|---|---|---|---|
| EP | 0 982 732 A1 | 3/2000 | ............ G11C/7/00 |
| EP | 0 999 549 A2 | 5/2000 | ........... G11B/20/10 |
| JP | 10028053 A2 | 1/1998 | ............ H03M/1/10 |
| WO | PCT/US99/05734 | 9/1999 | .......... H04N/7/167 |

OTHER PUBLICATIONS

U.S. application No. 09/643,819, Aram, filed Aug. 22, 2000.
U.S. application No. 09/654,392, Aram, filed Sep. 1, 2000.
U.S. application No. 09/648,770, Aram et al., filed Aug. 28, 2000.
U.S. application No. 09/648,464, Aram, filed Aug. 28, 2000.
Quantum Online / Inside Hard Disk Drives, "Part 2—A Closer Look at Hard Disk Drives"; "Chapter 3—Inside Hard Disk Drives—How They Work", Jun. 7, 2000.
Quantum Online / Recent Technological Developments, "Chapter 4—The Impact of Leading–Edge Technology on Mass Storage", Jun. 7, 2000.
Curtis Settles, "DSP–augmented CPU cores promise performance boost for ultra–compact drives", Data Storage, May 2000, pp. 35–38.

(List continued on next page.)

*Primary Examiner*—Kenneth B. Wells
*Assistant Examiner*—Terry L. Englund
(74) *Attorney, Agent, or Firm*—Eric B. Janofsky

(57) ABSTRACT

A circuit to generate a reference voltage from a power supply based on a predetermined voltage level, the reference voltage being used by a switched capacitor analog to digital converter includes a follower connected between the power supply and a current source to output the reference voltage. An amplifier is connected in a negative feedback arrangement with the reference voltage and the predetermined voltage level so as to provide an output, and a buffer provides a buffered output based on the output of the amplifier. A low pass filter provides a filtered voltage for the follower based on the buffered output, and a charge pump, connected to the buffered output, causes current to flow to the buffered output. The input impedance of the buffer as viewed from the charge bump is low for low frequencies and higher for higher frequencies, whereas the input impendence of the filter as viewed from the charge pump is low for high frequencies and higher for lower frequencies.

9 Claims, 7 Drawing Sheets

OTHER PUBLICATIONS

Stephen H. Lewis, "Optimizing the Stage Resolution in Pipelined Multistage, Analog–to–Digital Converters for Video–Rate Applications", IEEE Transactions on Circuits and Systems—II: Analog and Digital Signal Processing, vol. 30, No. 8, Aug. 1992, pp. 516–523.

Stephen H. Lewis, et al., "A 10–b 20–Msample/s Analog–to–Digital Converter", IEEE Journal of Solid–State Circuits, vol. 27, No. 3, Mar. 1992, pp. 351–358.

Stephen H. Lewis and Paul R. Gray, "A Pipelined 5–Msample/s 9–bit Analog–to–Digital Converter", IEEE Journal of Solid–State Circuits, vol. SC–22, No. 6, Dec. 1987, pp. 954–961.

Bhupendra K. Ahuja, "An Improved Frequency Compensation Technique for CMOS Operational Amplifiers", IEEE Journal of Solid–State Circuits, vol. SC–18, No. 6, Dec. 1983, pp. 629–633.

Sehat Sutarja and Paul R. Gray, "A Pipelined 13–bit, 250–ks/s, 5–V Analog–to–Digital Converter", IEEE Journal of Solid–State Circuits, vol. 23, No. 6, Dec. 1988, pp. 1316–1323.

Paul C. Yu, et al., "A 2.5–V, 12–b, 5–Msample/s Pipelined CMOS ADC," IEEE Journal of Solid–State Circuits, vol. 31, No. 12, Dec. 1996, pp. 1854–1861.

Stephen H. Lewis, et al., "Indirect Testing of Digital–Correction Circuits in Analog–to–Digital Converters with Redundancy," IEEE Transactions on Circuits and Systems—II: Analog and Digital Signal Processing, vol. 42, No. 7, Jul. 1995, pp. 437–445.

* cited by examiner

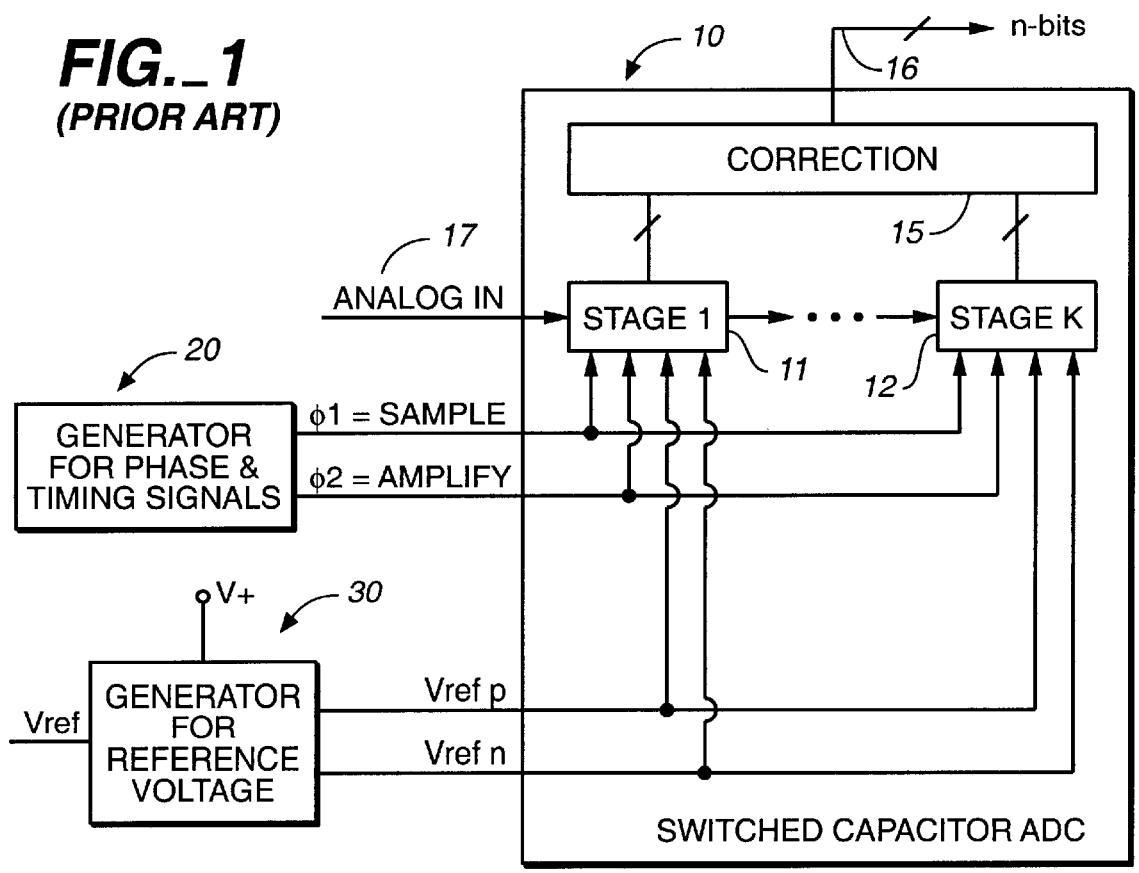
FIG._1
(PRIOR ART)
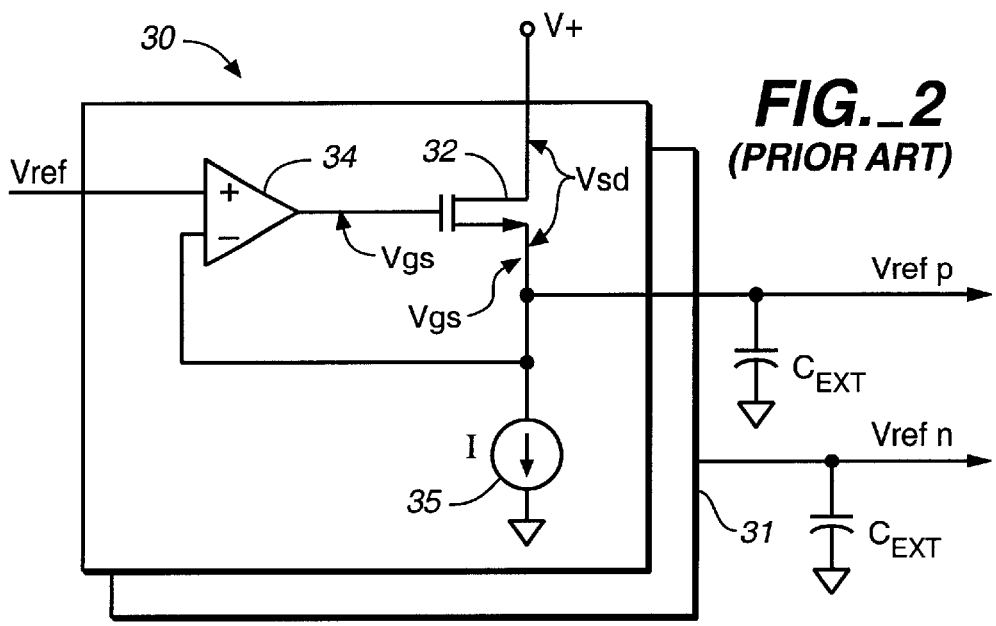
FIG._2
(PRIOR ART)

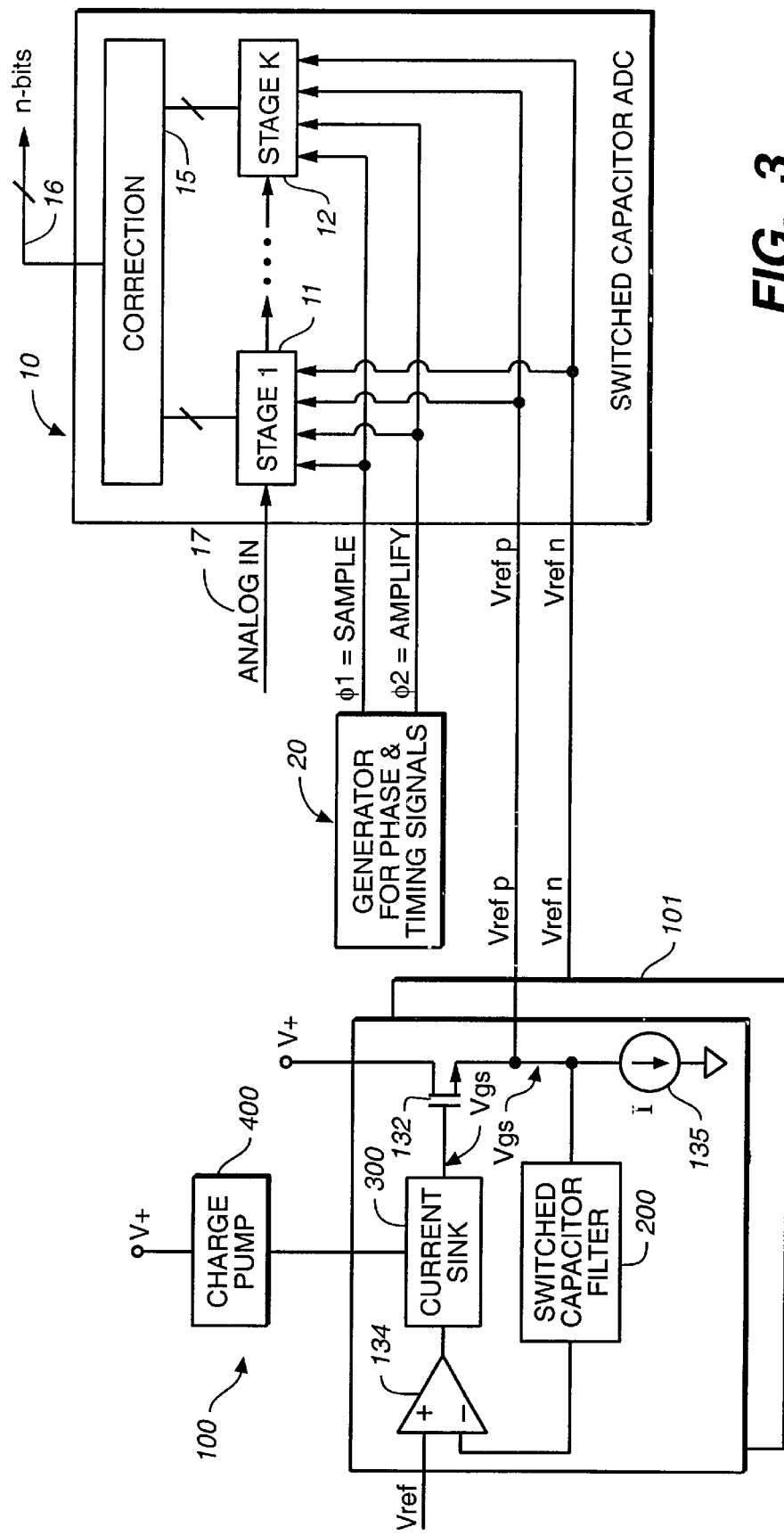
FIG._3

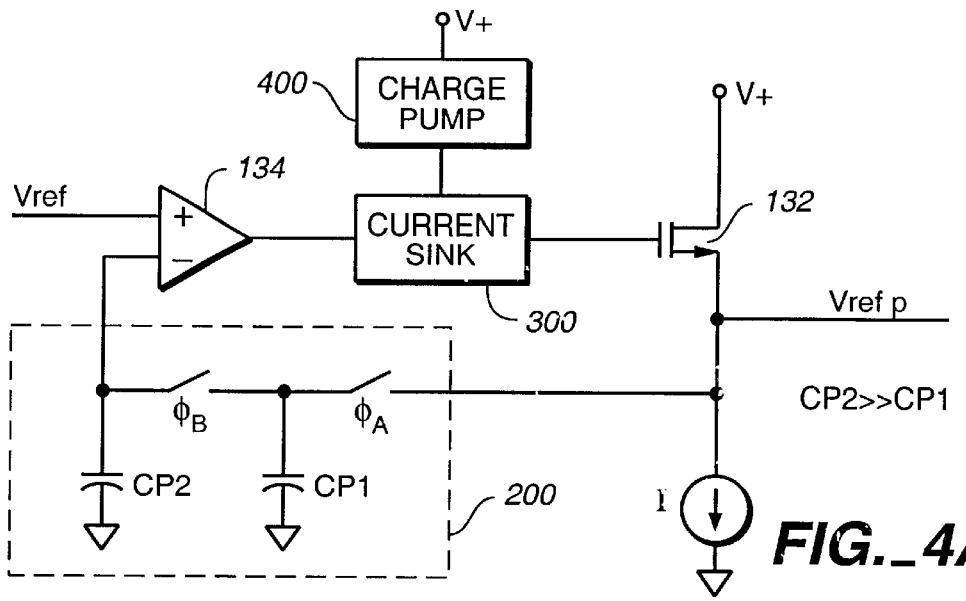
*FIG._4A*
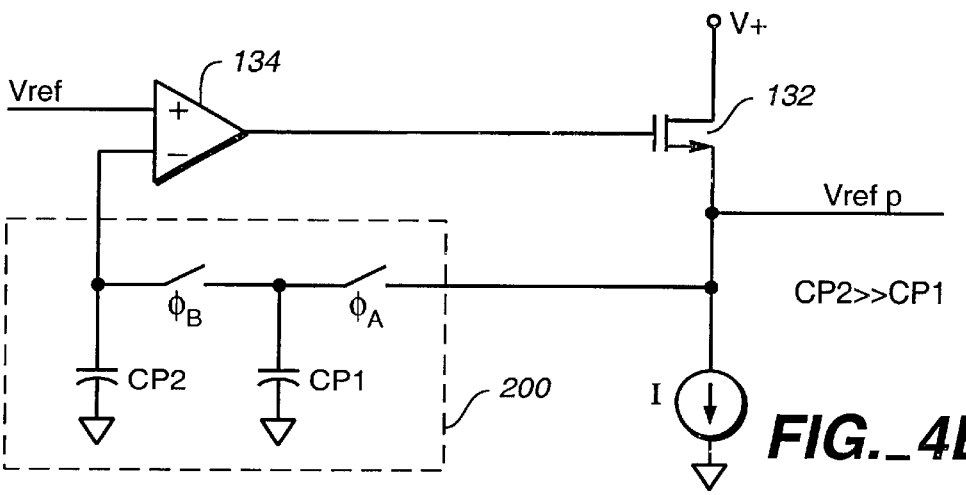
*FIG._4B*
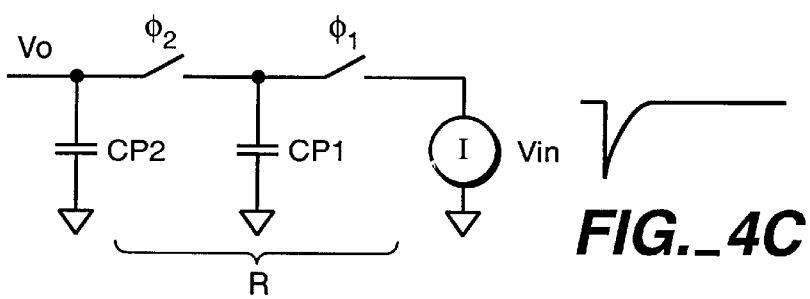
*FIG._4C*
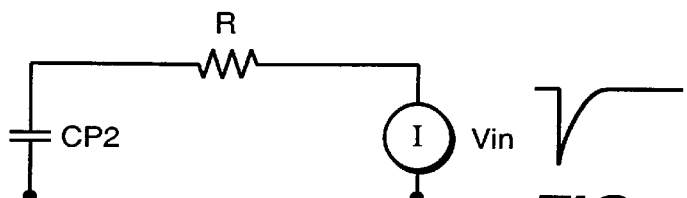
*FIG._4D*

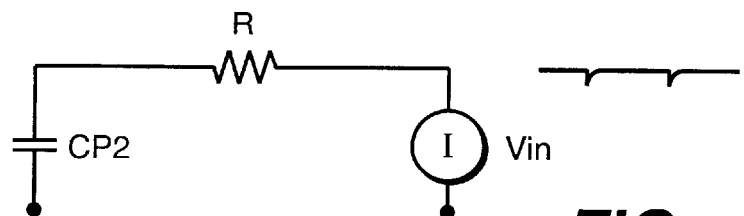
FIG._4E
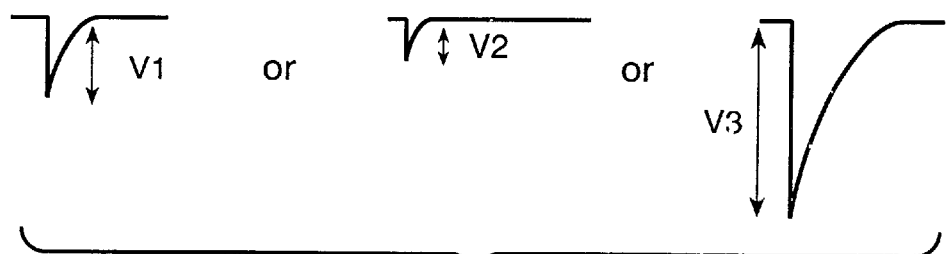
FIG._4F
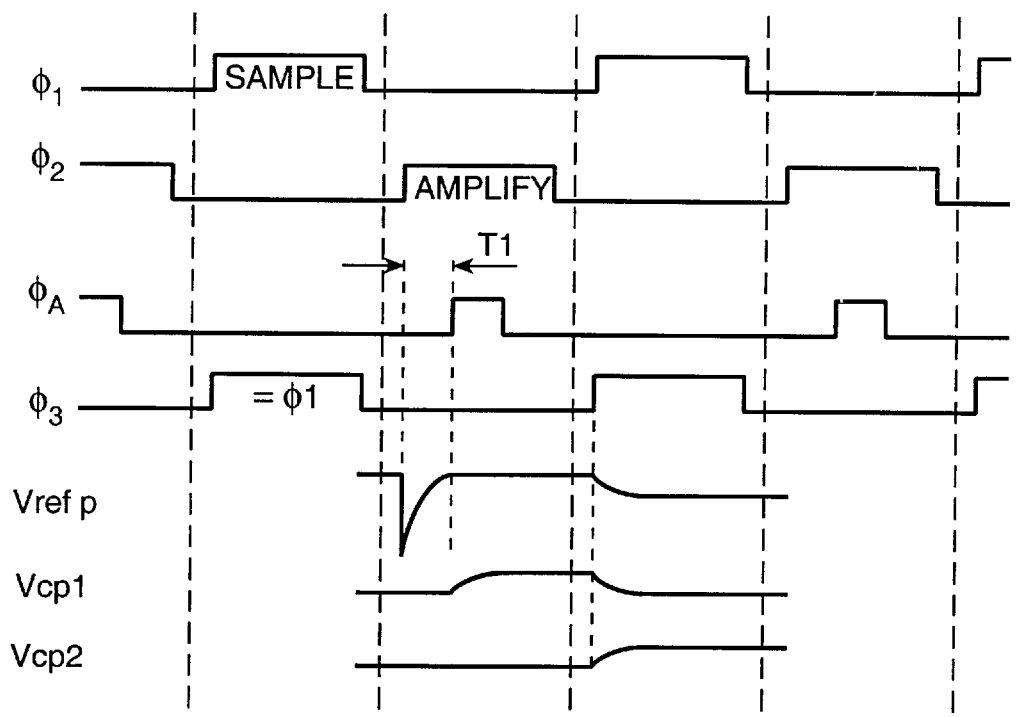
FIG._5

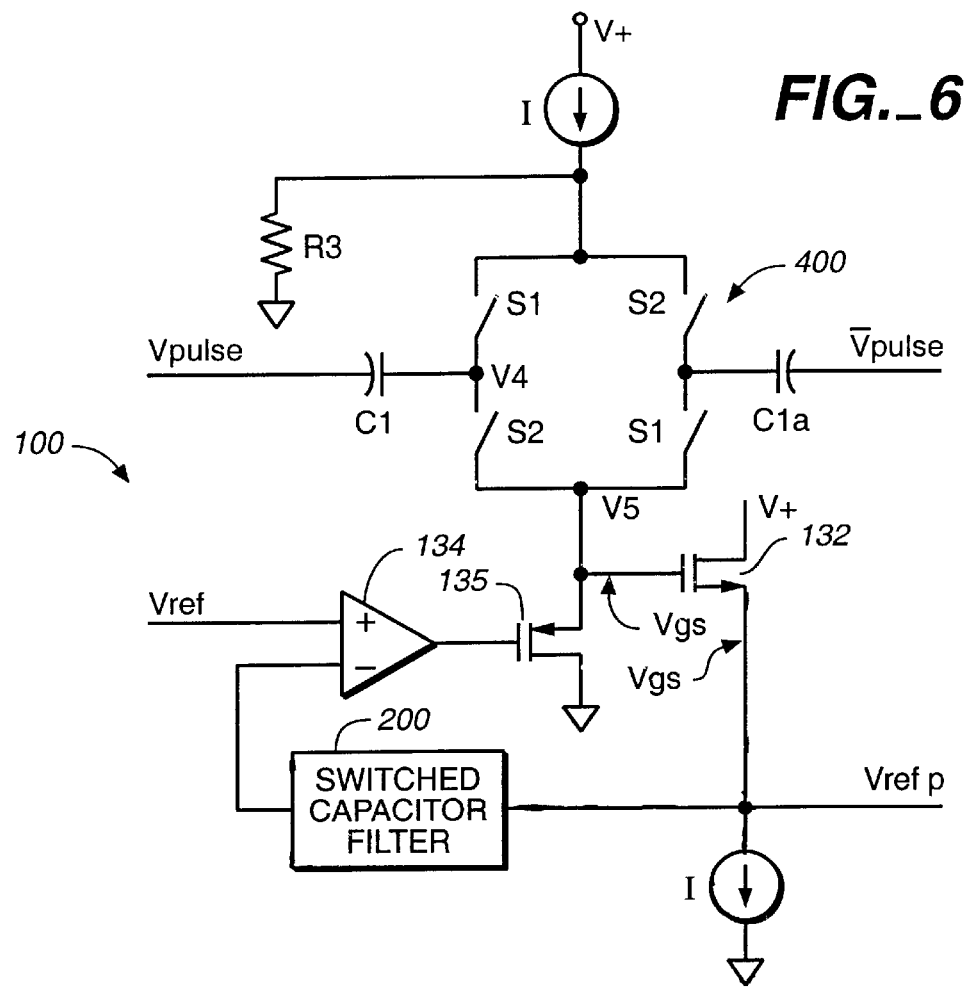
FIG._6
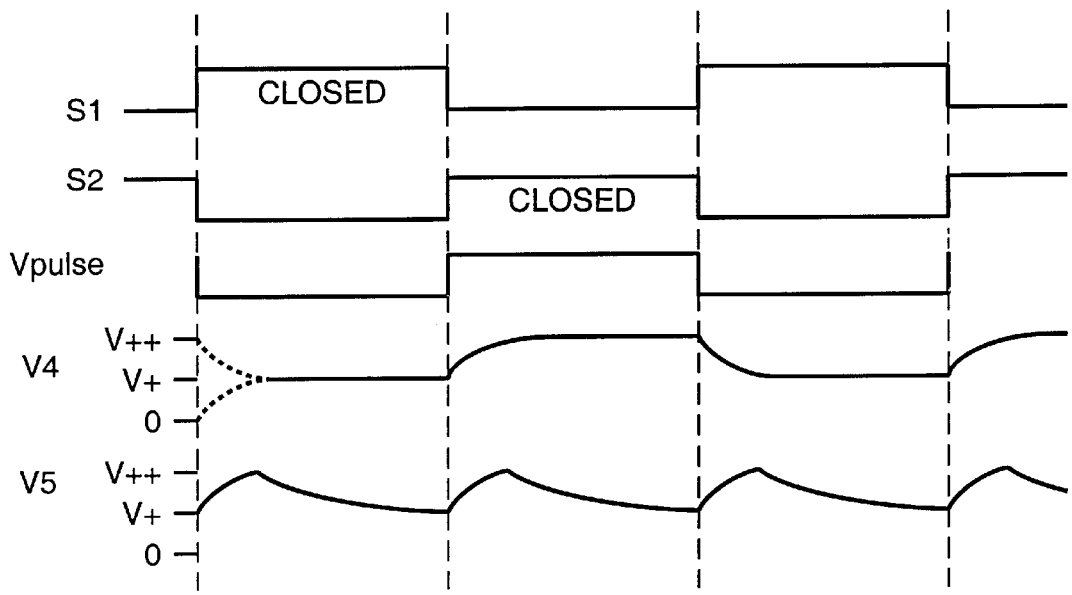
FIG._7

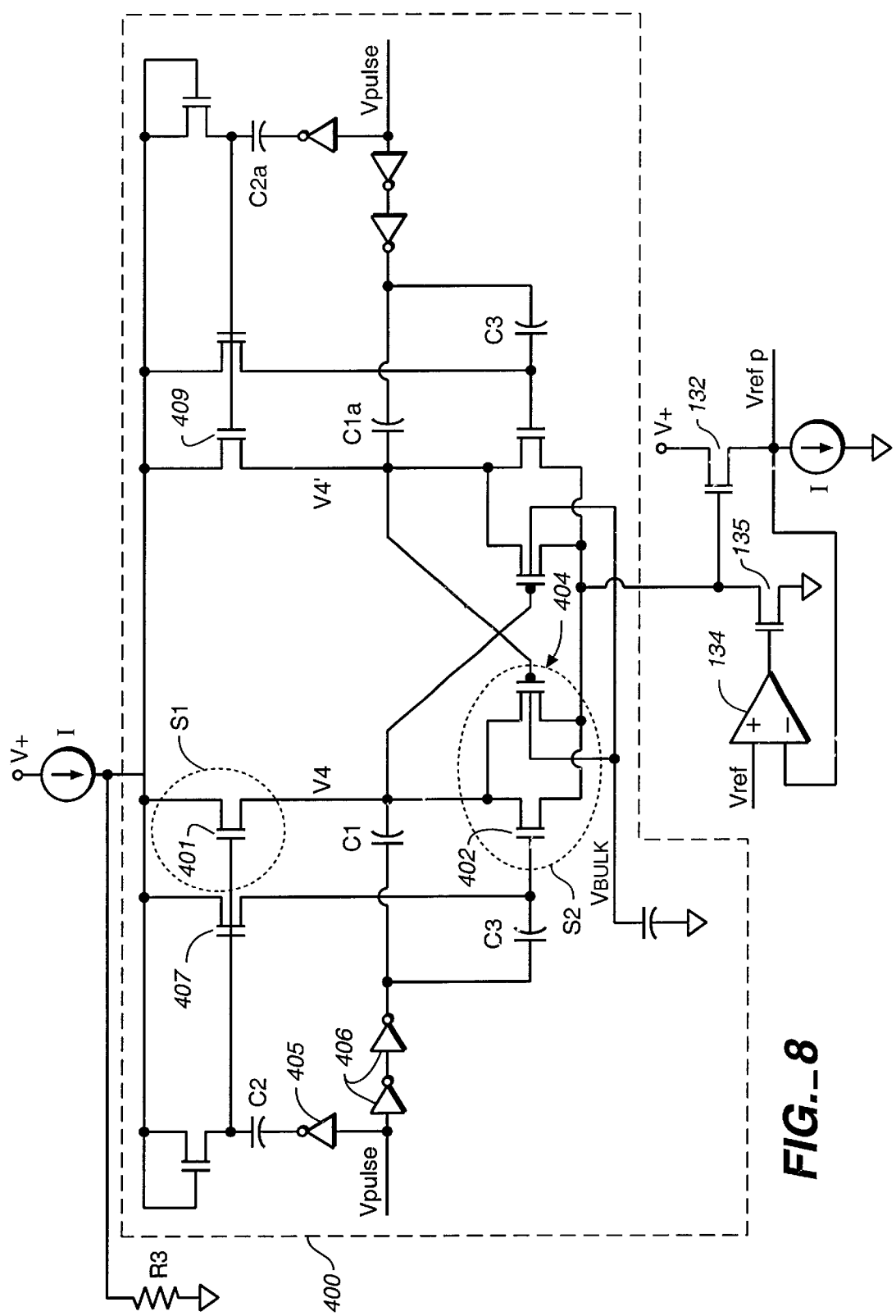
FIG._8

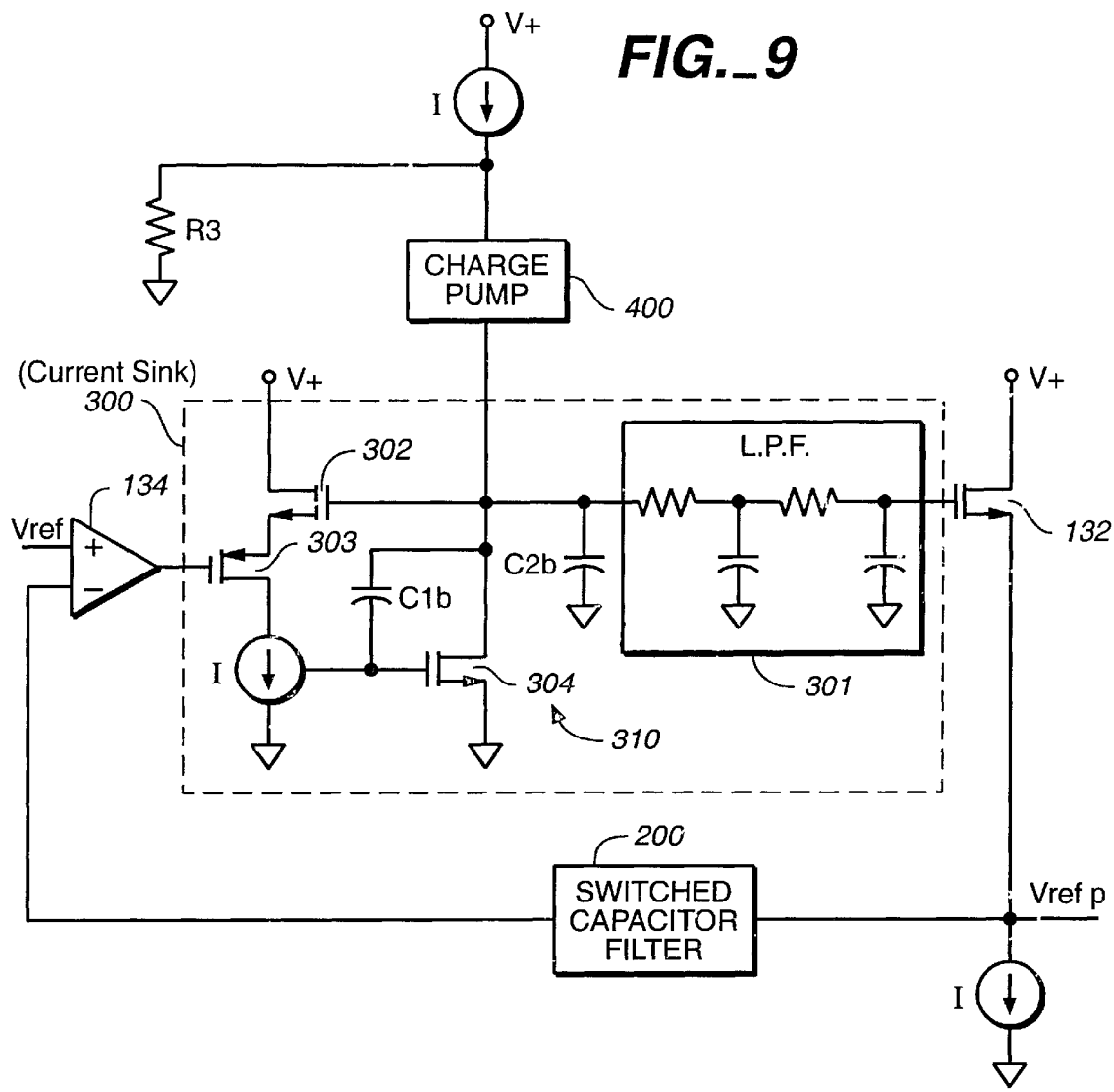
FIG._9
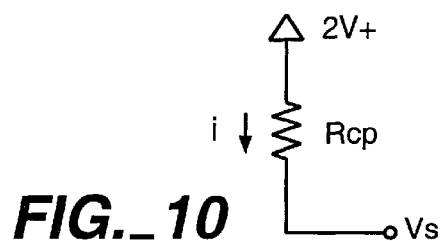
FIG._10

HIGH SPEED REFERENCE BUFFER

RELATED APPLICATIONS

This application is related to four other applications and all four applications are listed below. The contents of the two other applications, each filed concurrently herewith, are incorporated herein by reference as if set forth in full. (1) "Switched Capacitor Filter for Reference Voltages in Analog to Digital Converter" filed on Aug. 28, 2000 and assigned Ser. No. 09/648770; (2) "Analog-To-Digital Converter With Enhanced Differential Non-Linearity" filed on Aug. 22, 2000 and assigned Ser. No. 09/643819; (3) "Charge Pump for Reference Voltages in Analog to Digital Converter" filed on Aug. 28, 2000 and assigned Ser. No. 09/648464; and (4) "Frequency Compensation For a Linear Regulator"filed on Sep. 1, 2000 and assigned Ser. No. 09/654392.

BACKGROUND OF THE INVENTION

1. Field Of The Invention

The present invention relates to switched capacitor analog to digital converters (ADCs) and particularly relates to a current sink for use in establishing reference voltages for such ADCs.

2. Background Of The Invention

Switched capacitor ADCs provide efficient high speed conversion of analog signals to digital signals. A representative switched capacitor ADC is shown at 10 in FIG. 1, in the form of a multi-stage pipelined ADC. As seen there, ADC 10 includes multiple stages, such as stages 11 and 12, each providing one or more bits of digital data to a digital correction circuit 15, which resolves the digital output from each stage into an overall digital output 16 that corresponds to an analog input 17. Each stage is a switched capacitor circuit operating in response to clock signals such as φ1 and φ2 and comparing an analog voltage input to thresholds based on reference signals Vrefp and Vrefn so as to produce the digital outputs as well as a residual analog signal. The residual analog signal is provided as input to the subsequent stage, For proper operation of ADC 10, generators are needed for phase and timing signals as well as for reference voltages. These are shown respectively at 20 and 30 of FIG. 1. Thus, generator 20 for phase and timing signals generates clock signal φ1 for use during the sample phase of multiple stages 11 and 12, as well as clock signal φ2 for use during the amplification phase of multiple stages 11 and 12. Likewise, generator 30 generates reference voltages vrefp and Vrefn for use by multiple stages 11 and 12. The focus of the present application is on the generator 30 for the reference voltages.

FIG. 2 shows a conventional generator 30 for generating reference voltage Vrefp; a similar circuit shown schematically at 31 is used to generate reference voltage Vrefn. As shown in FIG. 2, generator 30 includes a follower 32 connected between voltage source V+ and a current source 35 which, in turn, is connected to ground. Follower 32 is driven at its gate side by amplifier 34, which is connected in negative feedback relationship using a reference voltage Vref as a reference and the output Vref as negative feedback. With this arrangement, follower 32 is driven by amplifier 34 so as to provide an output Vrefp with good current capabilities stabilized through negative feedback at a voltage level corresponding to Vref.

Problems arise, however, in use of generators in the form shown at 30. For example, due to higher frequency switching of generator 30, and due to noise/glitches generated from MDACS and capacitors which are connected to the reference generator 30, the amplifier 34 (FIG. 2) needs to be very fast, such that it can react quickly to the noise and reset Vrefp to an ideal value (e.g., preferably within a fraction of a clock period). How ever, this would be difficult to achieve for high speed ADcs. Also, amplifier thermal noise would be high in such cases, which would make the Vrefp signal noisy.

An alternative is to design a low bandwidth amplifier to slowly servo Vrefp, and to use an external capacitor (e.g., with a sufficiently large capacitance) to lower the impedance seen by the reference at high frequencies. This alternative may minimize switching glitches and noise, but it also requires extra circuitry, and for example, an extra pin.

Another problem involves the value of Vrefp relative to the source voltage V+. Specifically, because a voltage drop Vgs exists between the gate and source of follower 32, and because it is not possible for amplifier 34 to output a voltage greater than the supply voltage V+, the value of Vrefp must be lower than V+ by at least an amount equal to Vgs. Typically, Vgs is around 1v, and for adequate design margins, Vrefp is typically set to a value 1.5v less than source voltage V+. This amount of voltage drop, however, is wasteful and unnecessarily limits the dynamic conversion range of multiple stages 11 through 12.

SUMMARY OF THE INVENTION

It is an object of the present invention to address the foregoing through the provision of an improved generator for reference voltage signals used in a switched capacitor ADC.

In its most preferred form, a generator for reference voltage signals according to the invention is shown at 100 in FIG. 3. As seen there, the generator includes a follower 132 connected between a voltage source V+ and a current source 135 connected in turn to ground, as well as an amplifier 134 connected in negative feedback relationship with a reference voltage. Negative feedback to amplifier 134 is provided from the output of follower 132 (which forms the reference voltage signals Vrefp or Vrefn that are supplied to the ADC) through a switched capacitor filter 200.

The output of amplifier 134 is provided to a current sink 300 which drives the gate of follower 132. Current sink 300 has an effective resistance whose Value is low relative to that of other components in generator 100, thereby providing a path to sink current through follower 132 and thereby providing increased rejection of noise.

Source voltage for current sink 300 is provided through charge pump 400. Charge pump 400 operates to increase the effective voltage level of supply voltage V+ for use by current sink 300, thereby allowing a design in which reference voltages for ADC 10 (such as Vrefp and Vrefn) are set very nearly equal to supply voltage V+ in spite of the voltage drop Vgs of follower 132.

Although in its preferred form all three components (i.e., charge pump 400, current sink 300 and switched capacitor filter 200) are used in the construction of a generator for reference voltages, it is possible to use fewer than all three components, such as only one or two components.

This brief summary has been provided so that the nature of the invention may be understood quickly. A more complete understanding of the invention can be obtained by reference to the following detailed description of the preferred embodiment thereof in connection with the attached drawings.

BRIEF DESCRIPTION OF THE DRAWINGS

FIG. 1 is a view of a conventional switched capacitor ADC together with generators for phase and timing signals and reference voltages.

FIG. 2 is a view of a conventional generator for reference voltage signals.

FIG. 3 is a view showing a generator for reference voltages according to the present invention, connected to a switched capacitor ADC.

FIGS. 4A and 4B are views for explaining a switched capacitor filter for filtering the feedback leg of the feedback loop from noise generated by the switched capacitor ADC.

FIGS. 4C through 4F are views for explaining the general operation of a switched capacitor filter.

FIG. 5 is a view for explaining timing of the filter of FIGS. 4A through 4E.

FIG. 6 is a view for explaining the operational principle of a charge pump according to the invention.

FIG. 7 is a view for explaining timing signals for the charge pump of FIG. 6.

FIG. 8 is a detailed schematic view of a charge pump according to FIG. 6.

FIG. 9 is a view for explaining a current sink according to the invention.

FIG. 10 is a view for modeling a charge pump according to the invention.

DETAILED DESCRIPTION OF THE PREFERRED EMBODIMENT

Reverting again to FIG. 3, a switched capacitor ADC is shown in the form of a multi-stage pipelined ADC which includes multiple stages 11 through 12 each providing one or more bits of digital data to a digital correction circuit 15 which resolves the digital output from each stage into an overall digital output 16 that corresponds to an analog input 17. Each stage is a switched capacitor circuit operating in response to clock signal $\phi 1$ for a sample phase and clock signal $\phi 2$ for an amplifying phase, and comparing an analog voltage input to thresholds based on reference signals Vrefp and Vrefn so as to produce the digital outputs as well as a residual analog signal. The residual analog signal is provided as input to a subsequent stage.

Generator 20 provides phase and timing signals including clock signals $\phi 1$ and $\phi 2$.

Generator 100 generates reference voltages Vrefp and Vrefn for use by each of multiple stages 11 through 12. As §shown in FIG. 3, generator 100 generates reference voltage Vrefp which is output from the source terminal of follower 132 which is connected between voltage supply V+ and a current source 135 which in turn is connected to ground. Follower 132 is driven in negative feedback relationship to Vrefp through amplifier 134 whose reference is reference signal Vref. The negative feedback leg for amplifier 134 is provided through filter 200 which is a switched capacitor filter operating in synchronism with phase and timing signals $\phi 1$ and $\phi 2$ so as to sample and filter reference voltage Vrefp during known quiescent periods of the $\phi 1$ sample phase and the $\phi 2$ amplification phase.

The gate of follower 132 is driven by current sink 300, which accepts as its input the output from amplifier 134. Current sink 300 has an effective resistance which is low relative to other effective resistances in the circuit, thereby providing a low resistance path to sink current through follower 132 and thereby providing further immunization from the effects of high frequency noise.

A voltage source for current sink 300 is provided by charge pump 400 which provides an effectively higher voltage to current sink 300 than is otherwise available through supply Voltage V+. Because of the higher effective voltage provided by charge pump 400, it is possible to supply a reference voltage Vrefp which is very close to supply voltage V+, in spite of the existence of voltage drop Vgs across follower 132.

A complementary reference voltage generator 101 is provided for Vrefn. Circuit 101 involves components similar to switched capacitor filter 200, current sink 300 and charge pump 400, but operates those components in complementary relationship to those of generator 100 in correspondence to the reversed roles of $\phi 1$ and $\phi 2$ in the generator Each of the components of switched capacitor filter 200, current sink 300 and charge pump 400, are described in more detail below,

[Switched Capacitor Filter 200]

FIGS. 4A and 4B are views for explaining switched capacitor filter 200, which provides a final and settled value of the reference Vrefp signal for the feedback leg of amplifier 134. One difference between FIGS. 4A and 4B involves the presence in FIG. 4A of current sink 300 and charge pump 400, whereas those components are absent in the view of FIG. 4B. These views are therefore intended to reinforce the notion that less than all three components (i.e., switched capacitor filter 200, current sink 300 and charge pump 400) may be used in a generator for reference voltages, still with advantageous results.

General operating features of a switched capacitor filter 200 will be described with reference to FIGS. 4C through 4E. A source signal waveform is illustrated in each of these figures. As shown in FIGS. 4C and 4D, a combination of switches $\phi 1$ and $\phi 2$ (e.g., switches driven by clocks $\phi 1$ and $\phi 2$, respectively) and capacitor Cp1 is modeled as a resistor $R=1/(f \cdot Cp1)$, where f is the frequency of the $\phi 1$ and $\phi 2$ clocks. When $\phi 1$ and $\phi 2$ are non-overlapping clocks (e.g., as shown in FIG. 5), RCp2 low pass feedback is provided by the configuration shown in FIG. 4E, with $R=T/Cp1=1/(f \cdot Cp1)$. FIG. 4E illustrates the settling of the source signal.

In a situation where the source or excitation to such a switched capacitor filter is a glitch type signal for example V1, V2 and V3, e.g., every T/2 seconds, as shown in FIG. 4F, the height of the initial glitch is signal dependent. Hence, the average of this signal over one T period (e.g., low pass filtering the signal) can vary depending on signal value. To minimize this dependence, $\phi 1$ is preferably skewed such that the network RCp2 does not see a glitch. Instead the network preferably sees a partially settled signal. As a result, the signal dependency is reduced to the feedback amplifier.

Referring to FIGS. 4A and 4B, filter 200 includes switched capacitors Cp1 and Cp2 switched in accordance with clock signals $\phi a$ and $\phi b$. Clock signals $\phi a$ and $\phi b$ are, in turn, timed relative to clock signal $\phi 1$ (sample) and clock signal $\phi 2$ (amplify) for ADC 10. Preferably, the value of Cp2 is much greater than Cp1. For example, Cp2 is advantageously ten times the size of Cp1, such as Cp2=1 picofarad and Cp1=100 femtofarads. The purpose of this relationship is explained in more detail below.

In general, $\phi a$ is driven in synchronism with $\phi 2$ (amplification), but only after a time T1 from when amplification commences. The purpose for this delay T1 is to ensure that Vrefp has recovered to a relatively stable value after any initial noise spikes generated during initial stages of amplification by multiple stages 11 through 12. When $\phi a$ closes, Cp1 samples the value of Vrefp, and holds that value after $\phi a$ opens, during which time $\phi b$ remains open.

$\phi b$, on the other hand, is driven in synchronism with $\phi 1$ (sample), or more precisely is driven out of synchronism with $\phi a$. $\phi b$ closes while $\phi a$ is open, thereby allowing any charge accumulated on capacitor Cp2 to mix with the charge newly acquired by capacitor Cp1, which reflects the current voltage level of Vrefp. It is the voltage accumulated on Cp2 that is provided to the negative feedback leg of amplifier 134, and that value is maintained even after φb opens.

FIG. 5 is a timing diagram showing operation of switched capacitor filter 200. As previously described, φ1 and φ2 are sample and amplification signals, respectively, φa is driven in synchronism with amplification phase φ2 but commencing a short time T1 after amplification begins, and φb is driven out of synchronism with φa and preferably in synchronism with φ1. Immediately after amplification phase φ2 commences, Vrefp is subjected to a voltage spike which is quickly accommodated by follower 132 so as to return to a nominal value. T1 is selected at design time so that it is timed for this nominal value. After time T1, φa closes thereby allowing the voltage on capacitor Cp1 (designated as Vcp1) to follow any change in voltage level that might have occurred since the last closure of φa. φa then opens, followed by closure of φb, at which time the charge on capacitor Cp1 is mixed with the charge currently stored on capacitor Cp2, thereby resulting in a change in voltage impressed across capacitor Cp2 (designated as Vcp2). As further shown in FIG. 5, the output value of Vrefp follows the change in voltage across capacitor, Cp2 by virtue of the negative feedback relationship caused by amplifier 134.

The value for capacitor Cp2 is much greater than that for Cp1 because the purpose of capacitor Cp1 is to sample the voltage of Vrefp quickly, whereas the purpose of capacitor Cp2 is to accumulate charge over a longer period of time and to provide a reasonable damping effect with good response time. This relationship is obtained with the previously-described 10:1 ratio between capacitances for cp2 and Cp1. In a preferred embodiment, the pole (p) of the Cp2 capacitor is p=(Cp1/Cp2)·f, where f equals 125 MHz, Cp1/Cp2 equals 0.1, yielding a pole (p) of 12.5 MHz.

Because capacitor Cp2 is filtered from high frequency noise injected by ADC 10 onto Vrefp, noise rejection from amplifier 134 (and onto follower 132) is greatly enhanced with respect to conventional feedback relationships. That noise rejection is reflected by the absence of any external capacitor such as Cext found in conventional voltage generators, because such an external capacitor is ordinarily not required.

[Charge Pump 400]

Charge pump 400 is provided so as to produce an artificially elevated voltage level for follower 134, so that it is possible to run the reference voltages Vrefp and Vrefn very close to supply voltage V+, in spite of the presence of the voltage drop Vgs from gate to source of follower 132. FIG. 6 shows the operational principles of charge pump 400.

As shown in FIG. 6, the reference voltage Vrefp for ADC 10 is generated from the source terminal of follower 132 which is connected between supply voltage V+ and a current source, which, in turn, is connected to ground. Vrefp is monitored through a negative feedback relationship to amplifier 134 whose reference is provided by a reference voltage Vref and whose feedback leg is connected to switched capacitor filter 200. Alternatively, switched capacitor filter 200 need not be supplied. The output of amplifier 134 is provided to the gate of sink 135, whose source is connected to the gate of follower 132. Sink 135 is provided to allow a sink of current from drain to gate of follower 132, thereby providing an effectively low impedance looking inwardly toward sink 135 and amplifier 134.

The source terminal of sink 135 is supplied by charge pump 400. In principle, charge pump 400 operates to artificially elevate source voltage V+ through capacitive switching and capacitive biasing, as explained more fully below.

Specifically, charge pump 400 takes voltage source V+ through a current source and a biasing resistor R3 and connects to two pairs of diagonally complementary switches S1 and S2. These switches operate in connection with capacitors C1 and C1a which are biased in synchronism with operation of switches S1 and S2 through biasing pulse Vpulse.

In more detail, and focusing on the left leg of charge pump 400, when switch S1 is closed and in the absence of a biasing pulse on Vpulse, capacitor C1 charges to the level of supply voltage V+. Thereafter, switch S1 closes and Vpulse issues, thereby biasing the voltage at V4 upwardly from V+ by the value of Vpulse. Preferably, Vpulse is the same value as supply voltage V+, thereby effectively doubling the voltage at V4. in synchronism with the issuance of Vpulse, switch S2 closes, thereby providing a voltage at V5 which is elevated relative to supply voltage V+.

Diagonally complementary operations of switches S1 and S2 occur in the right leg of charge pump 400. Thus, while switch S2 in the left leg is open, switch S1 in the right leg is closed, thereby providing a biased voltage previously-impressed on capacitor C1a to voltage V5. This diagonally-complementary operation of switches ensures that the voltage at V5 is artificially elevated relative to supply voltage V+.

In practice, of course, the biased voltages across capacitors C1 and C1a are depleted by operation of current sink 135. This is shown in the waveforms of FIG. 7.

As shown in FIG. 7 and as previously described, switches S1 and S2 operate complementarily, and Vpulse operates in synchronism with closure of switch S2. During the time when switch S1 is closed, the voltage from capacitor C1 at V4 charges to the value of supply voltage V+. Thereafter, when switch S1 opens and switch S2 closes, and the voltage of capacitor C1 is biasedby issuance of Vpulse, the voltage at V4 increases to an elevated level relative to supply voltage V+ as signified by V++. Operation of current sink 135, however, discharges capacitor C1, thereby resulting in a charge/discharge cycle signified at V5 in FIG. 7. Notably, although the voltage V5 does not maintain its highest level at V++, it nevertheless maintains an average level which is elevated with respect to V+.

Because the voltage at V5 is elevated relative to supply voltage V+, it is possible to operate Vrefp at a value very close to supply voltage V+, in spite of the gate-to-source voltage drop Vgs across follower 132.

In practice, however, it turns out to be difficult to build switches S1 and S2 because those switches must be turned on and off with voltages on the order of the supply voltage V+, yet must control voltages of values elevated with respect to V+. FIG. 8 is a detailed schematic diagram for a practical implementation of charge pump 400.

As shown in FIG. 8, and focusing on the left leg of charge pump 400, switch S1 is formed by FET 401, and switch S2 is formed by a back-to-back connection of FET 402 and PMOSPET 404. Switch S1 is driven inversely from Vpulse through inverter 405, and capacitor C1 is biased in coordination with Vpulse through dual inverters 406. In addition, a helper capacitor C3 is switched and biased in coordination with capacitor C1 through FET 407 which operates as a switch.

In operation of the circuitry shown in FIG. 8, when switch S1 closes, capacitor C1 is charged to a voltage level corresponding to voltage supply V+. Correspondingly, capacitor C3 is charged through FET 407. Then, upon issuance of Vpulse, switch S1 opens and capacitor C1 is biased by the value of Vpulse. Corresponding, FET 407 opens and capacitor C3 is also biased by vpulse.

Closure of switch S2 is a two-part operation. In the first part, since the value of V4 is approximately twice the value of reference voltage V+, it is not possible for FET 402 to turn on and allow capacitor C1 to discharge to current sink 135. However, by virtue of the diagonally complementary operation of the switches in the right and left legs of charge pump 400, FET 409 is currently on and voltage at V4' is currently the same as supply voltage V+. The supply voltage drives the gate of PMOSFET 404 which therefore turns on and allows discharge of capacitor C1 to current sink 135. As capacitor C1 discharges, voltage at V4 decreases and will eventually decrease to a point where PMOS 404 can no longer remain on. However, by that time, the biased voltage from capacitor C3 allows FET 402 to turn on, thereby maintaining an "ON" state for switch S2 and continuously allowing capacitor C1 to discharge to sink 135. As will be appreciated by one of ordinary skill in the art, capacitor C2 and buffer 405 are configured as a level shifter.

Charge pump 400 can be modeled as a resistor Rcp and a voltage supply that preferably supplies a voltage of approximately two times (e.g., 2V+) a voltage source (e.g., V+), as shown in FIG. 10. A voltage V5 (i.e., V5=Vrefp+ Vgs) is established such that the current (i) through the charge pump (e.g., Rcp) can be approximated by i=(2V+−(Vrefp+Vgs))/Rcp.

[Current Sink 300]

FIG. 9 is a detailed schematic view showing current sink 300. Referring to the model shown in FIG. 10, the voltage V5 varies continuously according to the charge/discharge cycle shown at V5 in FIG. 7. Accordingly, if charge pump 400 is used, it is advantageous also to utilize a current sink 300 so as to reject noise generated by charge pump 400 in accordance with action of its switches S1 and S2.

As shown in FIG. 9, current sink 300 includes a low pass filter 301 which may include a simple RC circuit, which provides an input impedance (as viewed from the charge pump) that is low for high frequencies and higher for lower frequencies. The output of low pass filter 301 is provided to follower 132. The input to low pass filter 301 is provided by a buffer composed of the combination of FETs 302, 303 and 304 and capacitors C1 and C2. Operation of this buffer is described in more detail below. Generally speaking, however, the buffer provides a buffered output based on the output of amplifier 134 and further provides an input impedance (as viewed from the charge pump) which is low for low frequencies and higher for high frequencies, thereby acting as a current sink for the output of charge pump 400.

The buffer is referred to generally at reference numeral 310

At low frequency operation of buffer 310, the impedance thereof is influenced primarily by the transconductance of FET 302 since capacitor C1 is essentially open. Specifically, at low frequencies the impedance of buffer 310 is the inverse of the transconductance of FET 302, divided by the gain provided by FETs 303 and 304, As a consequence, low frequency impedance of buffer 310 is lower than that of current sink 135 (FIG. 6) because of the amplifying effect of FETs 303 and 304.

At mid to high frequencies, capacitor C1 shorts. Consequently, in the absence of low pass filter 301, the input impendence of buffer 310 would increase to approximately the inverse of the transconductance of FET 302 (i.e., not divided by the gain of FETs 303 and 304). However, the presence of low pass filter 301 effectively ensures that at higher frequencies, the overall input impedance of current sink 300 remains low.

By virtue of the coordination in input impedances of low pass filter 301 and buffer 310, it is possible to ensure that the overall input impedance of current sink 300 remains low throughout the frequency range of interest. As a consequence, because the input impedance is low, noise from charge pump 400 is rejected efficiently.

The invention has been described with respect to particular illustrative embodiments. It is to be understood that the invention is not limited to the above-described embodiments and that various changes and modifications may be made by those of ordinary skill in the art without departing from the spirit and scope of the invention.

What is claimed is:

1. A circuit to generate a reference voltage from a power supply, based on a predetermined voltage level, the reference voltage being used by a switched capacitor analog-to-digital converter, said circuit comprising:

a follower connected between the power supply and a current source to output the reference voltage;

an amplifier connected in a negative feedback arrangement with the reference voltage and the predetermined voltage level so as to provide an output;

a buffer to provide a buffered output based on the output of said amplifier;

a low pass filter to provide a filtered voltage for said follower based on the buffered output; and a charge pump connected to the buffered output to cause current to flow to the buffered output;

wherein input impedance of said buffer as viewed from said charge pump is low for low frequencies and higher for higher frequencies; and wherein input impedance of said filter as viewed from said charge pump is low for high frequencies and higher for lower frequencies.

2. A circuit according to claim 1, wherein said low pass filter comprises a resistor/capacitor circuit.

3. A circuit to generate a reference voltage, from a power supply, based on a predetermined voltage level, the reference voltage being used by a switched capacitor analog-to-digital converter, said circuit comprising:

a follower connected between the power supply and a current source to output the reference voltage;

an amplifier connected in a negative feedback arrangement with the reference voltage and the predetermined voltage level so as to provide an output;

a buffer to provide a buffered output based on the output of said amplifier;

a low pass filter to provide a filtered voltage for said follower based on the buffered output; and a charge pump connected to the buffered output to cause current to flow to the buffered output;

wherein input impedance of said buffer as viewed from said charge pump is low for low frequencies and higher for higher frequencies; and wherein input impedance of said filter as viewed from said charge pump is low for high frequencies and higher for lower frequencies, wherein said buffer includes a current sink in amplified feedback relation with a capacitor-shunted amplifier such that the input impedance of said buffer for low frequencies is the reciprocal of transconductance of said current sink divided by gain of said capacitor-shunted amplifier, and such that the input impedance of said buffer for higher frequencies is the inverse of transconductance of said current sink.

4. A circuit to generate a reference voltage, from a power supply, based on a predetermined voltage level, the reference voltage being used by a switched capacitor analog-to-digital converter, said circuit comprising:

follower means connected between the power supply and a current source, for outputting the reference voltage;

amplifier means connected in a negative feedback arrangement with the reference voltage and the predetermined voltage level, for providing an output;

buffer means for providing a buffered output based on the output of said amplifier means;

low pass filter means for providing a filtered voltage for said follower means based on the buffered output; and charge pump means connected to the buffered output for causing current to flow to the buffered output;

wherein input impedance of said buffer means as viewed from said charge pump means is low for low frequencies and higher for higher frequencies; and wherein input impedance of said filter means as viewed from said charge pump means is low for high frequencies and higher for lower frequencies.

5. A circuit according to claim 4, wherein said low pass filter means comprises a resistor/capacitor circuit.

6. A circuit to generate a reference voltage, from a power supply, based on a predetermined voltage level, the reference voltage being used by a switched capacitor analog-to-digital converter, said circuit comprising:

follower means connected between the power supply and a current source, for outputting the reference voltage;

amplifier means connected in a negative feedback arrangement with the reference voltage and the predetermined voltage level, for providing an output;

buffer means for providing a buffered output based on the output of said amplifier means;

low pass filter means for providing a filtered voltage for said follower means based on the buffered output; and charge pump means connected to the buffered output for causing current to flow to the buffered output;

wherein input impedance of said buffer means as viewed from said charge pump means is low for low frequencies and higher for higher frequencies; and wherein input impedance of said filter means as viewed from said charge pump means is low for high frequencies and higher for lower frequencies, wherein said buffer means includes current sink means in amplified feedback relation with a capacitor-shunted amplifier means such that the input impedance of said buffer means for low frequencies is the reciprocal of transconductance of said current sink means divided by gain of said capacitor-shunted amplifier means, and such that the input impedance of said buffer means for higher frequencies is the inverse of transconductance of said current sink means.

7. A reference voltage circuit to generate a reference voltage from a power supply comprising:

a charge pump;

a buffer responsive to said charge pump and an amplified voltage to provide a bias voltage;

a low pass filter responsive to the bias voltage to provide a filtered bias voltage;

a follower responsive to the power supply, a current source, and the filtered bias voltage, to output the reference voltage; and an amplifier configured in a negative feedback arrangement with the reference voltage and a predetermined voltage to provide the amplified voltage, wherein input impedance of said buffer as viewed from said charge pump is low for low frequencies and higher for higher frequencies; and wherein input impedance of said filter as viewed from said charge pump is low for high frequencies and higher for lower frequencies.

8. A reference voltage circuit to generate a reference voltage from a power supply comprising:

charge pump means for providing a current;

buffer means responsive to said charge pump and an amplified voltage for providing a bias voltage;

low pass filter means for filtering the bias voltage to provide a filtered bias voltage;

follower means responsive to the power supply, a current source, and the filtered bias voltage, for outputting the reference voltage; and amplifier means for differentially amplifying the reference voltage and a predetermined voltage to provide the amplified voltage, wherein input impedance of said buffer means as viewed from said charge pump means is low for low frequencies and higher for higher frequencies; and wherein input impedance of said filter means as viewed from said charge pump means is low for high frequencies and higher for lower frequencies.

9. A method for generating a reference voltage from a power supply comprising the steps of:

providing a current;

buffering the current and an amplified voltage for providing a bias voltage such that an input impedance is low for low frequencies and higher for higher frequencies;

low pass filtering the bias voltage to provide a filtered bias voltage such that an input impedence is low for high frequencies and higher for lower frequencies;

outputting the reference voltage responsive to the power supply, a current source, and the filtered bias voltage; and differentially amplifying the reference voltage and a predetermined voltage to provide the amplified voltage.

* * * * *